(12) United States Patent
Vangilbergen et al.

(10) Patent No.: US 11,686,690 B2
(45) Date of Patent: Jun. 27, 2023

(54) SYSTEM AND METHOD FOR INSPECTION AND METROLOGY OF FOUR SIDES OF SEMICONDUCTOR DEVICES

(71) Applicant: KLA Corporation, Milpitas, CA (US)

(72) Inventors: Bert Vangilbergen, Tienen (BE); Harry Paredaens, Erps-Kwerps (BE); Maarten Brocatus, Milpitas, CA (US); Foon Ming Chan, Hong Kong (HK)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/330,220

(22) Filed: May 25, 2021

(65) Prior Publication Data

US 2022/0146438 A1 May 12, 2022

Related U.S. Application Data

(60) Provisional application No. 63/112,650, filed on Nov. 12, 2020.

(51) Int. Cl.
*G01N 21/95* (2006.01)
*G01N 21/88* (2006.01)
*H01L 21/66* (2006.01)

(52) U.S. Cl.
CPC ..... *G01N 21/9503* (2013.01); *G01N 21/8806* (2013.01); *H01L 22/12* (2013.01)

(58) Field of Classification Search
CPC ........... G01N 21/9503; G01N 21/8806; G01N 2021/8841; H01L 22/12; H01L 21/67144
See application file for complete search history.

(56) References Cited

U.S. PATENT DOCUMENTS

| 6,094,263 A | 7/2000 | Tomiya et al. |
| 7,554,655 B2 * | 6/2009 | Fairley ............... G01N 21/9501 356/237.4 |
| 9,816,938 B2 | 11/2017 | Amanullah |

(Continued)

FOREIGN PATENT DOCUMENTS

| KR | 20190000477 A | 1/2019 |
| KR | 20190106098 A | 9/2019 |
| WO | 2019156286 A1 | 8/2019 |

OTHER PUBLICATIONS

International Search Report and Written Opinion for International Application No. PCT/US2021/057485 dated Feb. 28, 2022, 8 pages.

Primary Examiner — Hung V Nguyen
(74) Attorney, Agent, or Firm — Suiter Swantz pc llo (57) ABSTRACT

A method of inspection or metrology of four sides of a sample is disclosed. The method includes providing samples in a carrier at a first side of an imaging tool and moving the samples from the carrier to the imaging tool via a pick-and-place stage assembly. The method includes imaging first and second sides of the samples via first and second channels of the imaging tool and returning the samples to the carrier. The method includes rotating the carrier by 90 degrees and translating the carrier to an opposite side of the imaging tool and moving the samples individually from the carrier to the imaging tool. The method includes imaging a third and fourth side of the sample via the first and second channel of the imaging tool and returning the one or more samples from the imaging tool to the carrier.

17 Claims, 9 Drawing Sheets

(56) References Cited

U.S. PATENT DOCUMENTS

| | | | |
|---|---|---|---|
| 10,107,761 B2 * | 10/2018 | Shmarev | G01N 21/956 |
| 10,190,994 B2 | 1/2019 | Truyens | |
| 2015/0138341 A1 | 5/2015 | Amanullah | |
| 2015/0147141 A1 | 5/2015 | Truyens | |
| 2017/0115232 A1 * | 4/2017 | Sullivan | G01N 21/9501 |
| 2020/0319443 A1 * | 10/2020 | Liu | G02B 21/364 |

* cited by examiner

SYSTEM AND METHOD FOR INSPECTION AND METROLOGY OF FOUR SIDES OF SEMICONDUCTOR DEVICES

CROSS-REFERENCE TO RELATED APPLICATION

The present application claims the benefit of U.S. Provisional Application Ser. No. 63/112,650, filed Nov. 12, 2020, which is incorporated herein by reference in the entirety.

TECHNICAL FIELD

The present disclosure relates generally to the inspection or metrology of up to four sides of a semiconductor device and, in particular, an inspection or metrology system including a carrier system for rotating a characterized sample to allow the inspection or metrology of four sides of a semiconductor device.

BACKGROUND

The semiconductor device industry requires inspection and metrology tools capable of inspection and critical dimension metrology of four sides of semiconductor devices. A common solution to this challenge is the implementation of a 'mirror block' imaging system. Mirror block imaging is used to image four or five sides of a semiconductor device. Prior mirror block systems suffer from limited illumination angles and mirror block hardware being linked to object dimensions and carrier dimensions. Prior mirror block systems also require manual changeover to image all sides of a given object, which significantly limits throughput. Such systems tend to operate slowly as only a single imaging device is in operation and the objects must move in and out of the mirror block (up/down) in series. The mirror used in the mirror block and the imaged object must fit in one field of view (FOV). It is desirable to provide a system and method that cures the deficiencies of the prior approaches outlined above.

SUMMARY

A system for characterizing four sides of a semiconductor device is disclosed, in accordance with one or more embodiments of the present disclosure. In one illustrative embodiment, the system includes a sample carrier. In another illustrative embodiment, the system includes a pick-and-place head. In another illustrative embodiment, the system includes an imaging subsystem including a first channel and a second channel, where the stage assembly may transfer the sample between the carrier and the imaging subsystem. In another illustrative embodiment, the system includes a controller having one or more processors and memory. The one or more processors may execute a set of program instructions stored in the memory. In another illustrative embodiment, the controller may direct the stage assembly to move the sample from the carrier located at a first position to the imaging subsystem. In another illustrative embodiment, the controller may direct the imaging subsystem to inspect a first side of the sample via the first channel of the imaging subsystem and a second side of the sample via the second channel of the imaging subsystem. In another illustrative embodiment, the controller may direct the stage assembly to move the sample from the imaging subsystem to the carrier. In another illustrative embodiment, the controller may direct the carrier to move to a second position. In another illustrative embodiment, the controller may direct the carrier to rotate by 90 degrees relative to the orientation of the carrier in the first position. In another illustrative embodiment, the controller may direct the stage assembly to move the sample from the carrier located at the second position to the imaging subsystem. In another illustrative embodiment, the one or more processors may direct the imaging subsystem to inspect a third side of the sample via the first channel of the imaging subsystem and a fourth side of the sample via the second channel of the imaging subsystem.

A characterization system is disclosed in accordance with one or more illustrative embodiments of the present disclosure. In one illustrative embodiment, the system includes a controller communicatively couplable to an imaging subsystem. In another illustrative embodiment, the controller directs a stage assembly of the imaging subsystem to move a sample from a carrier located at a first position to the imaging subsystem. In another embodiment, the controller directs the imaging subsystem to image a first side of the sample via a first channel of the imaging subsystem and a second side of the sample via a second channel of the imaging subsystem. In another illustrative embodiment, the controller directs the stage assembly to move the sample from the imaging subsystem to the carrier. In another illustrative embodiment, the controller directs the carrier to move to a second position. In another illustrative embodiment, the controller directs the carrier to rotate 90 degrees relative to the orientation of the carrier in the first position. In another illustrative embodiment, the controller directs the stage assembly to move the sample from the carrier located at the second position to the imaging subsystem. In another illustrative embodiment, the controller directs the imaging subsystem to inspect a third side of the sample via the first channel of the imaging subsystem and a fourth side of the sample via the second channel of the imaging subsystem.

A method is disclosed in accordance with one or more illustrative embodiments of the present disclosure. In one illustrative embodiment, the method includes providing a plurality of samples in a carrier at a first side of an imaging tool. In another illustrative embodiment, the method includes moving one or more of the samples from the carrier to the imaging tool via a pick-and-place stage assembly. In another illustrative embodiment, the method includes imaging a first side of one or more samples via a first channel of the imaging tool and a second side of the one or more samples via a second channel of the imaging tool. In another illustrative embodiment, the method includes moving the one or more samples from the imaging tool to the carrier via the pick-and-place stage assembly. In another illustrative embodiment, the method includes rotating the carrier by 90 degrees and translating the carrier to a second side of the imaging tool opposite the first side. In another illustrative embodiment, the method includes moving the one or more samples from the carrier to the imaging tool via the pick-and-place stage assembly. In another illustrative embodiment, the method includes imaging a third side of the one or more samples via the first channel of the imaging tool and a fourth side of the one or more samples via the second channel of the imaging tool. In another illustrative embodiment, the method includes moving the one or more samples from the imaging tool to the carrier via the pick-and-place stage assembly. In another illustrative embodiment, the method includes combining image data from the first side, second side, third side, and fourth side of the one or more samples. In another illustrative embodiment, the method includes characterizing the one or more samples based on the image data from the first side, second side, third side, and fourth side of the one or more samples.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Figure 1A:
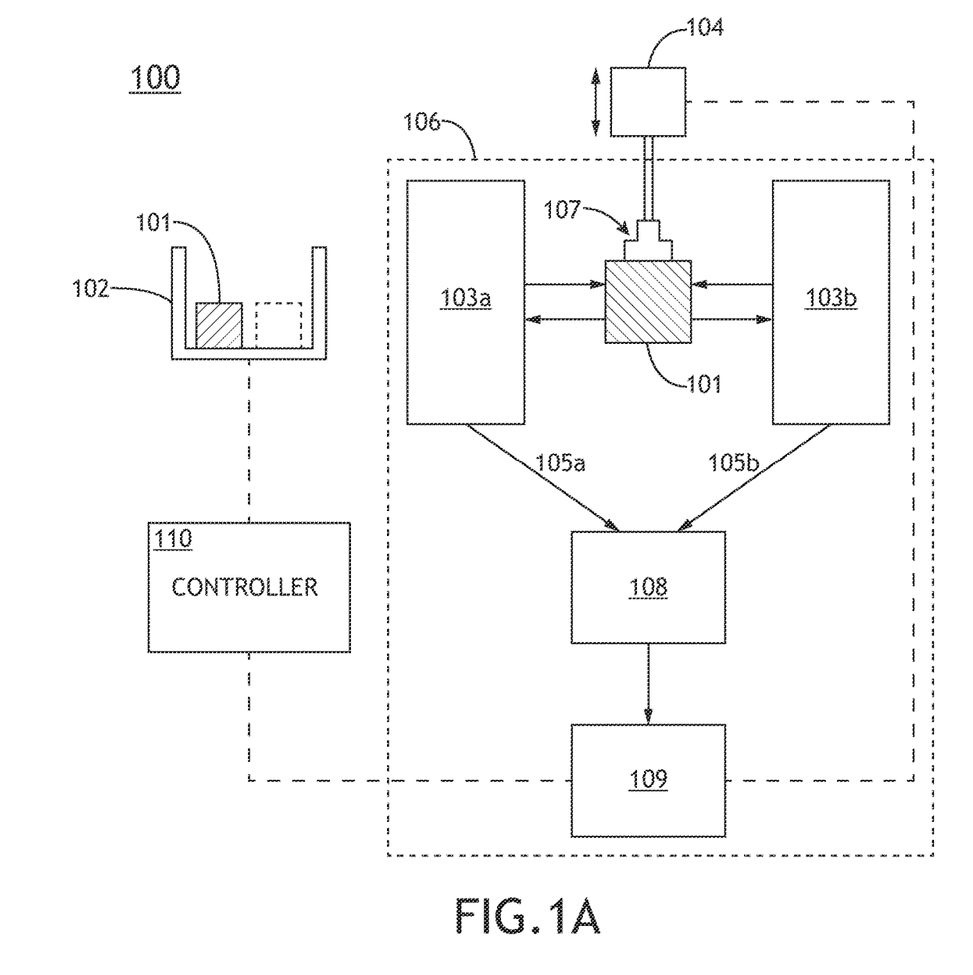
FIG. 1A illustrates a conceptual view of a characterization system able to image four sides of a sample, in accordance with one or more embodiments of the present disclosure.

FIG. 1A illustrates a conceptual view of a characterization system 100 capable of imaging four sides of samples, in accordance with one or more embodiments of the present disclosure. In embodiments, the system 100 includes a sample carrier 102, a stage assembly 104, an imaging subsystem 106, and a controller 110. The characterization system 100 is configured to provide simultaneous acquisition (i.e., a single camera sensor exposure) of two sides of a sample 101 and a process work flow of multiple samples that allows the system 100 to present the samples to the imaging subsystem 106 at least two times with an orientation difference of 90 degrees. This approach allows for the characterization system 100 to perform inspection and/or metrology of all four sides of the samples 101. In embodiments, the characterization system 100 may carry out inspection measurements to identify defects on the surface of any four sides of the sample 101 and/or metrology measurements to measure critical dimensions of any four sides of the sample 101.

In embodiments, the imaging subsystem 106 of the characterization system 100 includes a first channel 103a and a second channel 103b. In addition, the imaging subsystem 106 includes a set of collection optics 108 configured to receive first channel illumination 105a from the sample 101 and second channel illumination 105b collected from the sample 101 and direct the first channel illumination 105a and the second channel illumination 105b to a camera 109. The stage assembly 104 may include, but is not limited to, a pick-and-place head 107 (e.g., vacuum-based pick-and-place head) configured to transfer the sample 101 between the carrier 102 and the imaging subsystem. The samples 101 that need to be inspected/measured are placed on the carrier 102. The carrier 102 may then be rotated 90 degrees in between inspections/measurements to allow for inspection and metrology of all four sides of the each of the samples 101 by the same imaging subsystem 106. Since only two sides of the object are simultaneously inspected, the sample 101 needs to be rotated 90 degrees to inspect all four sides of the objects. It is noted that the sample 101 may be rotated in any number of ways. For example, the option with the smallest overhead cycle time includes rotating the carrier 102 by 90° as an intermediate step in between measurements, eliminating the need to rotate samples via the pick-and-place head 107. It is noted that, since only two sides of the sample 101 are inspected at once, the system 100 may eliminate the up/down motion of the sample 101 in/out of the imaging cavity, which results in a higher throughput. It is further noted that the ability to simultaneously present multiple components for inspection also improves system throughput.

In embodiments, the characterization system 100 includes a controller 110. The controller 110 may include one or more processors and memory, the one or more processors configured to execute a set of program instructions stored in the memory. In this sense, the set of program instructions may be configured to cause the one or more processors to carry out any of the process and control steps of the present disclosure.

In embodiments, the controller 110 is configured to direct the stage assembly 104 to move the sample from the carrier located at a first position to the imaging subsystem 106. In embodiments, the controller 110 directs the imaging subsystem 106 to inspect a first side of the sample 101 via the first channel 103a of the imaging subsystem 106 and a second side of the sample 101 via the second channel 103b of the imaging subsystem 106. In embodiments, the controller 110 directs the stage assembly 104 to move the sample 101 from the imaging subsystem 106 to the carrier 102. In embodiments, the controller 110 directs the carrier 102 to move to a second position such that the sample 101 is rotated by 90 degrees relative to the first position. In embodiments, the controller 110 directs the stage assembly 104 to move the sample 101 from the carrier 102 located at the second position to the imaging subsystem 106. In embodiments, the controller 110 directs the imaging subsystem 106 to inspect a third side of the sample 101 via the first channel 103a of the imaging subsystem 106 and a fourth side of the sample 101 via the second channel 103b of the imaging subsystem 106. In embodiments, the controller 110 may receive measurement data from the camera 109 to characterize (e.g., inspect or measure) a structure on or in sample 101 and/or control one or more portions of the characterization system 100.

Figure 1B:
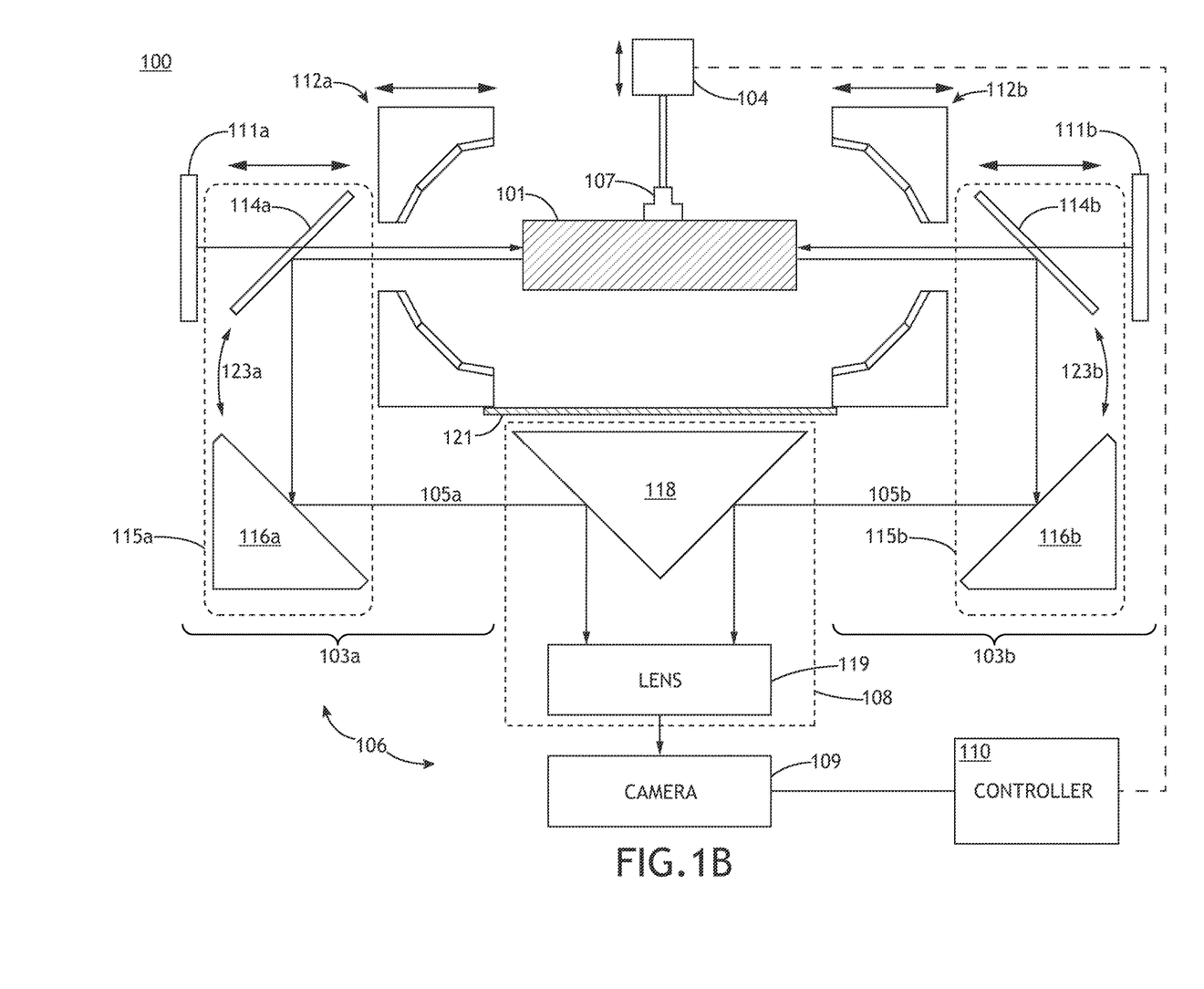
FIG. 1B illustrates a schematic view of the characterization system, in accordance with one or more embodiments of the present disclosure.

FIG. 1B illustrates a schematic view of the characterization system 100, in accordance with one or more embodiments of the present disclosure. In this embodiment, the first channel 103a includes a first light assembly and the second channel 103b includes a second light assembly. The first light assembly may include a first coaxial light source 111a and a first oblique light source 112a. The second light assembly may include a second coaxial light source 111b and a second oblique light source 112b.

In embodiments, the first coaxial light source 111a and the second coaxial light source 111b include one or more RGB light sources. In embodiments, the first channel 103a includes a first set of optics 123a and the second channel 103b includes a second set of optics 123b. In embodiments, the first set of optics 123a and the second set of optics 123b are configured to pass illumination from the coaxial sources 103a,103b to the sample 101, while also directing coaxial and oblique illumination reflected or scattered from the sample to the collection optics 108 and camera 109. For example, the first set of optics 123a may include, but is not limited to, a first beam splitter 114a and a first mirror 116a. The first beam splitter 114a may be configured to pass illumination from the first coaxial source 111a to the sample 101 and reflect illumination reflected/scattered from the sample 101 or received from the opposite side of the imaging sub-system 106 (i.e., first channel illumination 105a) toward the first mirror 116a (e.g., 45° mirror). The first mirror 116a may reflect the first channel illumination 105a toward the collection optics 108 and camera 109. Similarly, the second set of optics 123b may include, but is not limited to, a second beam splitter 114b and a second mirror 116b. The second beam splitter 114b may be configured to pass illumination from the second coaxial source 111b to the sample 101 and reflect illumination reflected/scattered from the sample 101 or received from the opposite side of the imaging subsystem 106 (i.e., second channel illumination 105b) toward the second mirror 116b (e.g., 45° mirror). The second mirror 116b may reflect the second channel illumination 105b toward the collection optics 108 and camera 109.

In embodiments, the first oblique light source 112a and the second oblique light source 112b each include one or more RGB sources. In this embodiment, each side of the optical path may contain two sources of oblique RGB light positioned between the beam splitters 114a,114b and the sample 101, with the optical path passing between both oblique RGB light sources. Each oblique RGB light source can emit RGB light under different angles. Light originating from the oblique RGB light sources 112a,112b reflects on the sample 101 and is reflected by the beam splitter 114a, 114b closest to the given oblique RGB light source 112a, 112b onto the respective mirror 116a,116b. Then, the light is reflected towards the collection optics 108 and camera 109. In embodiments, for each side of the optical path, both elements (top and bottom) of the oblique RGB light source 112a,112b are secured to a rigid bracket (not shown) to ensure relative positions between the different components do not change.

In embodiments, the collection optics 108 of the imaging subsystem 106 include a rooftop mirror 118 and a lens 119. The rooftop mirror 118 reflects the first channel illumination 105a and the second channel illumination 105b into the lens 119 and camera 109. In embodiments, each side of the optical path, the beam splitter, diffuser, light sources, and mirror are fixed together with a rigid bracket to ensure the relative positions of the different building blocks do not change.

In embodiments, diffusers (not depicted) may be placed between the coaxial illumination sources 103a,103b and the beam splitters 114a,114b. The diffusers help ensure homogenous coaxial illumination impinges on the sample 101 from the sources 103a,103b.

In embodiments, the imaging subsystem 106 includes a plate 121 positioned below the imaging region of the imaging subsystem 106. The plate 121 is positioned to prevent light originating from either the coaxial light sources 111a, 111b or the oblique light sources 112a,112b from reaching the camera/lens system directly (i.e., without following the optical path defined by the beam splitters 114a,114b, mirrors 116a,116b, and the rooftop mirror 118). In embodiments, the plate 121 is positioned above the rooftop mirror 118 and below the lower elements of the oblique illumination sources 112a,112b.

In embodiments, the first set of optics 115a and the second set of optics 115b are attached to separate motorized stages. This enables the system 100 to simultaneously move both parts of the movable optics in or outwards horizontally (i.e., left/right in FIG. 1B, ensuring the correct free working distance between the lens 119 and sample 101 is maintained, resulting in the sides of the sample 101 being in the focal plane of the camera-lens system. By moving the assemblies in/outwards, smaller/bigger objects can be imaged.

In embodiments, the first oblique light source 112a and the second oblique light source 112b are fixed to separate motorized stages. This enables the system 100 to simultaneously move both parts of the oblique illumination in- or outwards horizontally (i.e., left/right in FIG. 1B), allowing the system 100 to maintain the correct distance with respect to the edge of the sample 101 under investigation. Maintaining this correct distance ensures the sample 101 is illuminated under the correct angles and the illumination is homogeneous.

In embodiments, prior to the imaging of the sample 101, the movable optics 115a, 115b and the movable oblique light sources 112a, 112b are moved to their correct position, to ensure the sample 101 is positioned in the focal plane of the camera-lens system, illuminated under the correct angles, and the illumination is homogeneous. During imaging, a pick-and-place head 107 of the stage assembly 104 holds the sample 101 under investigation by applying a vacuum and presents the sample 101 to the imaging subsystem 106, where images (amount determined by the application: inspection and/or metrology) are taken of the two sides of the sample 101 oriented towards the oblique illumination and the movable optics. In embodiments, the camera 109 is connected to a frame grabber (not depicted). The frame grabber may apply image processing on the acquired image (s) to detect defects and perform metrology on the sample 101 under investigation.

In embodiments, the imaging subsystem 106 may acquire multiple images of the sample 101 using front and backlight from the light sources 111a, 111b, 112a, and 112b by combining camera readout and illumination triggering.

In embodiments, the imaging subsystem 106 may acquire images of samples of different sizes by changing camera position (via a camera stage/motor) and/or positions of the mirrors 116a, 116b (via a mirror stage/motor). It is noted that mirrors 116a, 116b are decoupled from the sample size. Such a configuration allows for the inspection of larger objects and allows for automated changeover. By motorizing the movement of the mirrors 116a, 116b, it is possible to change from small objects (e.g., approximately 2 mm) to large objects (e.g., approximately 150 mm) without the manual changeover of an operator as would be the case for traditional mirror blocks.

In embodiments, the imaging subsystem 106 may control the angle of the mirrors 116a,116b (e.g., via mirror stages) to detect defects on the edge and/or top or bottom of the sample 101 at a shallow angle. In this manner, the mirrors 116a,116b may adjust the illumination pathways 105a,105b such that the lens/camera system collect light reflecting off of one or more edges and/or the top or bottom of the sample 101.

The one or more processors of controller 110 may include any one or more processing elements known in the art. In this sense, the one or more processors may include any microprocessor-type device configured to execute software algorithms and/or instructions. The one or more processors may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors. In general, the term "processor" may be broadly defined to encompass any device having one or more processing elements, which execute program instructions from memory. Moreover, different subsystems of the system 100 (e.g., light sources, camera, detector assembly 104, additional controllers, and the like) may include processor or logic elements suitable for carrying out at least a portion of the steps described throughout the present disclosure.

The memory of the controller 110 may include any storage medium known in the art suitable for storing program instructions executable by the associated one or more processors and the data received from the imaging subsystem 106. For example, the memory may include a non-transitory memory medium. For instance, the memory may include, but is not limited to, a read-only memory (ROM), a random-access memory (RAM), a magnetic or optical memory device (e.g., disk), a magnetic tape, a solid-state drive and the like. It is further noted that memory may be housed in a common controller housing with the one or more processors. In an alternative embodiment, the memory may be located remotely with respect to the physical location of the processors, controller 110, and the like. In embodiments, the memory maintains program instructions for causing the one or more processors to carry out the various steps described through the present disclosure.

Figure 1C:
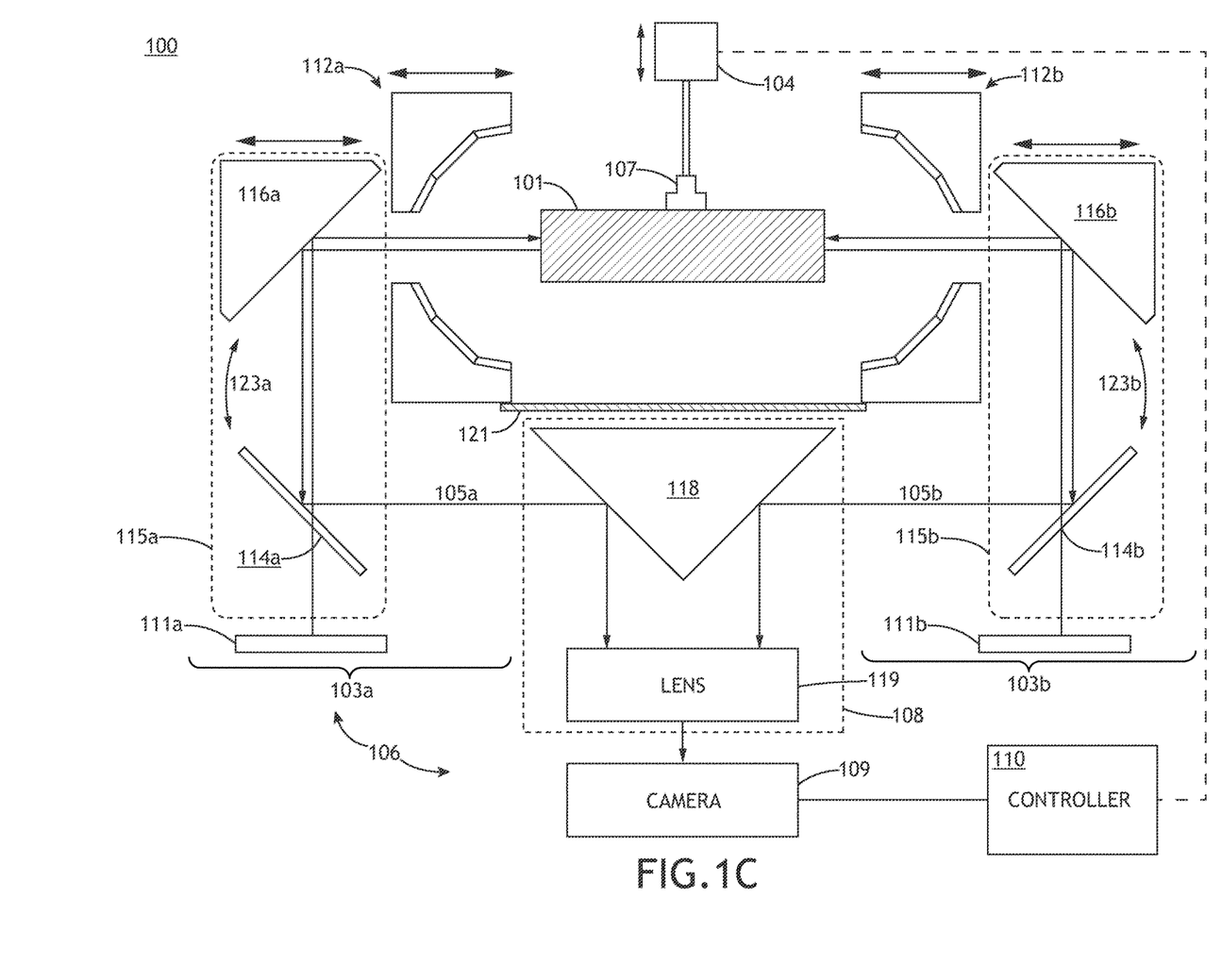
FIG. 1C illustrates a schematic view of the characterization system, in accordance with one or more alternative embodiments of the present disclosure

It is noted that the optical arrangement depicted in FIG. 1B should not be interpreted as a limitation on the scope of the present disclosure. Rather, it is contemplated that scope of the present disclosure may extend to any optical arrangement capable of carrying out the functions described herein. For example, FIG. 1C depicts an alternative and/or an additional embodiment of characterization system 100. In this embodiment, the coaxial light sources 111a,111b are located below the beam splitters 114a,114b and mirrors 116a,116b.

Figure 2:
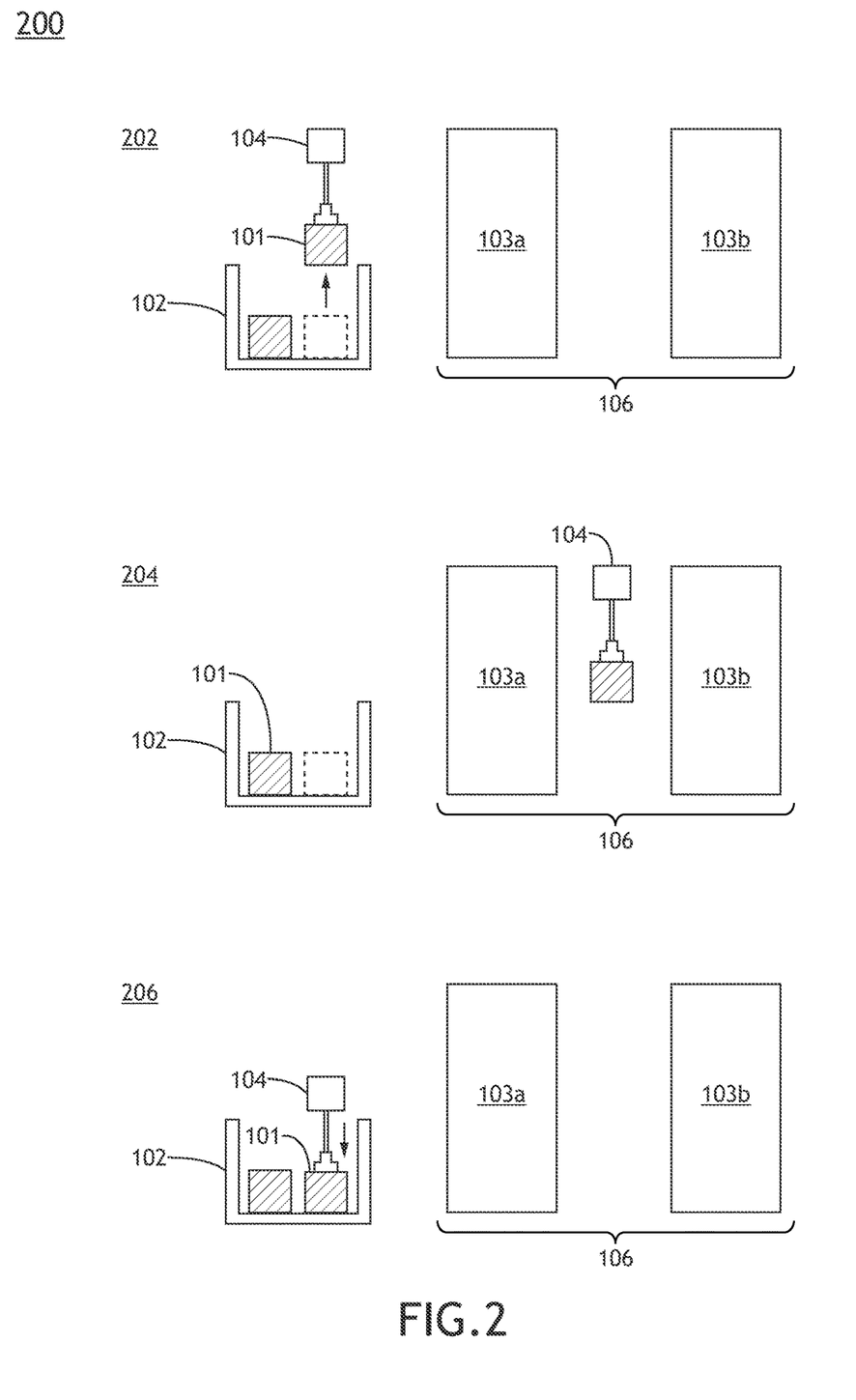
FIG. 2 illustrates a conceptual view of a process flow for carrying out four-side characterization, in accordance with one or more embodiments of the present disclosure.

FIG. 2 illustrates a conceptual view of a process flow 200 for carrying out four-side characterization, in accordance with one or more embodiments of the present disclosure. It is noted that the various control and processing steps of the process depicted in FIG. 1B may be carried out via controller 110, which is not depicted in FIG. 1B for the purposes of clarity. In a first step 202, the pick-and-place head 107 (e.g., vacuum nozzle) of the stage assembly 104 captures a sample 101 and removes it from carrier 102. In a second step 204, the pick-and-place head 107 of the stage assembly 104 places the sample 101 within the imaging region of the imaging sub-system 106. At this point, the imaging sub-system 106 acquires image data from the first and second sides (left and right in FIG. 1B) via the first channel 103a and the second channel 103b respectively. In a third step 206, the pick-and-place head 107 of the stage assembly 104 moves the sample 101 from the imaging sub-system 106 back into the carrier 102. Steps 204 and 206 may be repeated for each sample 101 contained within the carrier 102. In a fourth step 208, the carrier 102 is rotated by 90° and translated to the opposite side of the imaging sub-system 106 such that the samples 101 within the carrier 102 are rotated by 90° relative to the initial position in step 202 and the pick-and-place head 107 of the stage assembly 104 captures the sample 101 and removes it from the carrier 102. It is noted that the carrier 102 may be adjusted in alternative manners to achieve the 90° rotation and need not be translated to the opposite side of the imaging sub-system 101. In a fifth step 210, the pick-and-place head 107 of the stage assembly 104 places the sample 101 within the imaging region of the imaging sub-system 106 with the sides of the sample 101 rotated 90° relative to the imaging step of 204. At this point, the imaging sub-system 106 acquires image data from the third and fourth sides (front and back in FIG. 1B) via the first channel 103a and the second channel 103b respectively. In a sixth step 212, the pick-and-place head 107 of the stage assembly 104 moves the sample 101 from the imaging sub-system 106 back into the carrier 102. Steps 210 and 212 may be repeated for each sample 101 contained within the carrier 102. The image data collected from the first, second, third, and fourth sides for each sample 101 may then be combined by the controller 110 and analyzed (e.g., inspection and/or metrology).

Figure 3:
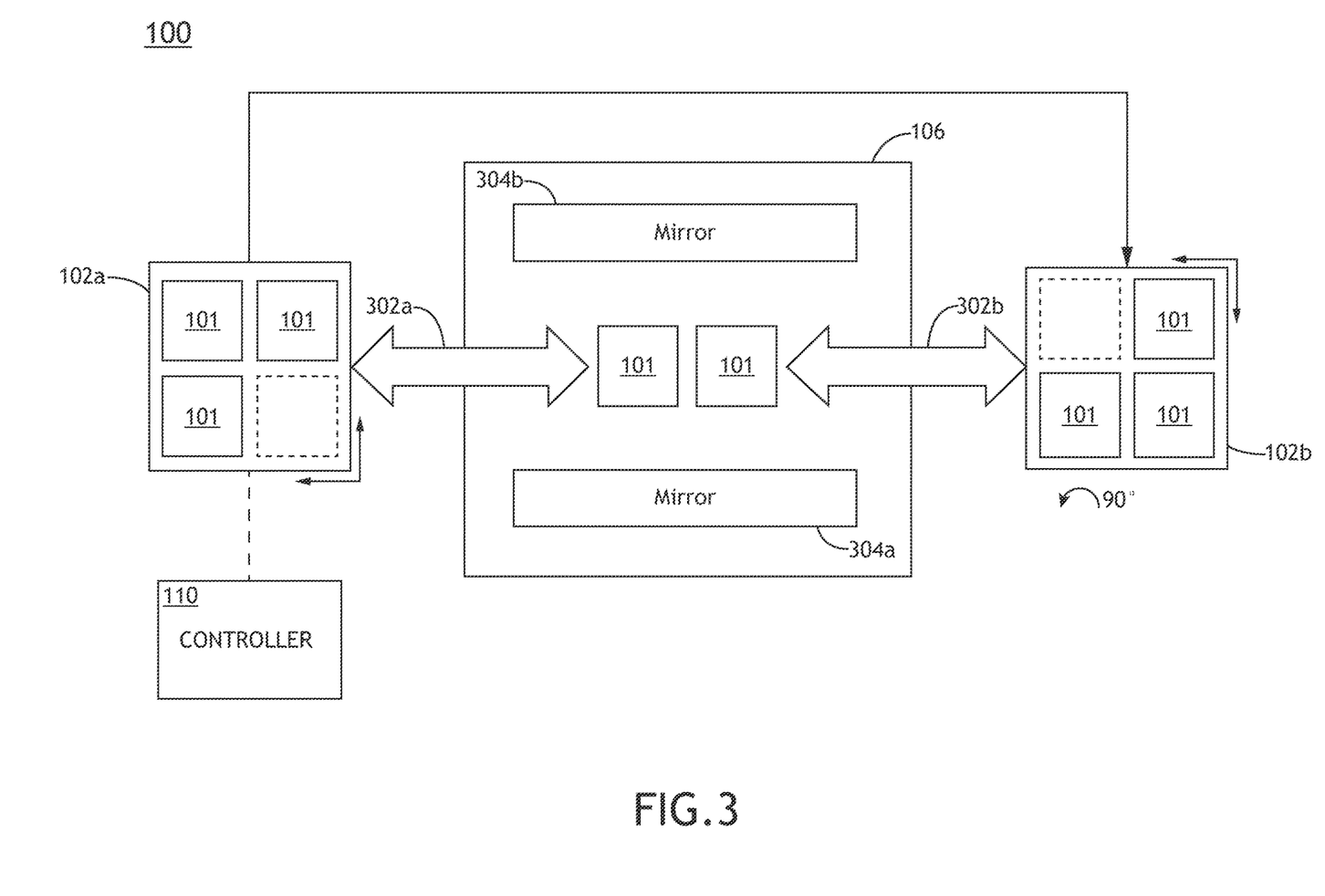
FIG. 3 illustrates a conceptual top view of the characterization system including two pick-and-place heads and corresponding imaging flow for imaging two samples in parallel, in accordance with one or more embodiments of the present disclosure.

FIG. 3 illustrates a conceptual top view of the characterization system 100 including two pick-and-place heads 107 and corresponding imaging flow for imaging two samples 101 in parallel, in accordance with one or more embodiments of the present disclosure. It is noted that the pick-and-place heads 107 of this embodiment are not depicted in FIG. 3, but the motion of the samples imparted by the pick-and-place heads is represented by the arrows 302a, 302b. In this embodiment, the imaging subsystem 106 images first, second, third, and fourth sides (e.g., front, back, left, and right sides) of the samples 101 in parallel. In this regard, while one pick-and-place head 107 is moving back to the carrier 102 and picks up samples 101 from the carrier 102, the other pick-and-place head 107 presents samples 101 to the imaging subsystem 106. In embodiments, once the imaging subsystem 106 has imaged the first and second sides of the samples 101 in carrier 102a, the controller 110 may direct carrier 102a to move (e.g., via track or robot) to the opposite side of the imaging sub-system 106 and rotate by 90°. At the same time, after the imaging subsystem 106 has imaged the third and fourth sides of the samples 101 of carrier 102b, the controller 110 may direct carrier 102b to be offloaded (e.g., via robot). This process can then be repeated continuously. It is noted that, while FIG. 3 indicates a single sample being removed from each carrier 102a/102b for inspection, such a configuration should not be interpreted as a limitation on the scope of the present disclosure. The system 100 may remove multiple samples 101 from a carrier 102a/102b and present them for inspection. For example, the system 100 may remove a row of samples 101 from the carriers 102a/102b and present the entire row for inspection by the inspection subsystem 106. It is noted that that the dual pick-and-place flow depicted in FIG. 3 increases throughput relative to a single pick-and-place flow.

Figure 4:
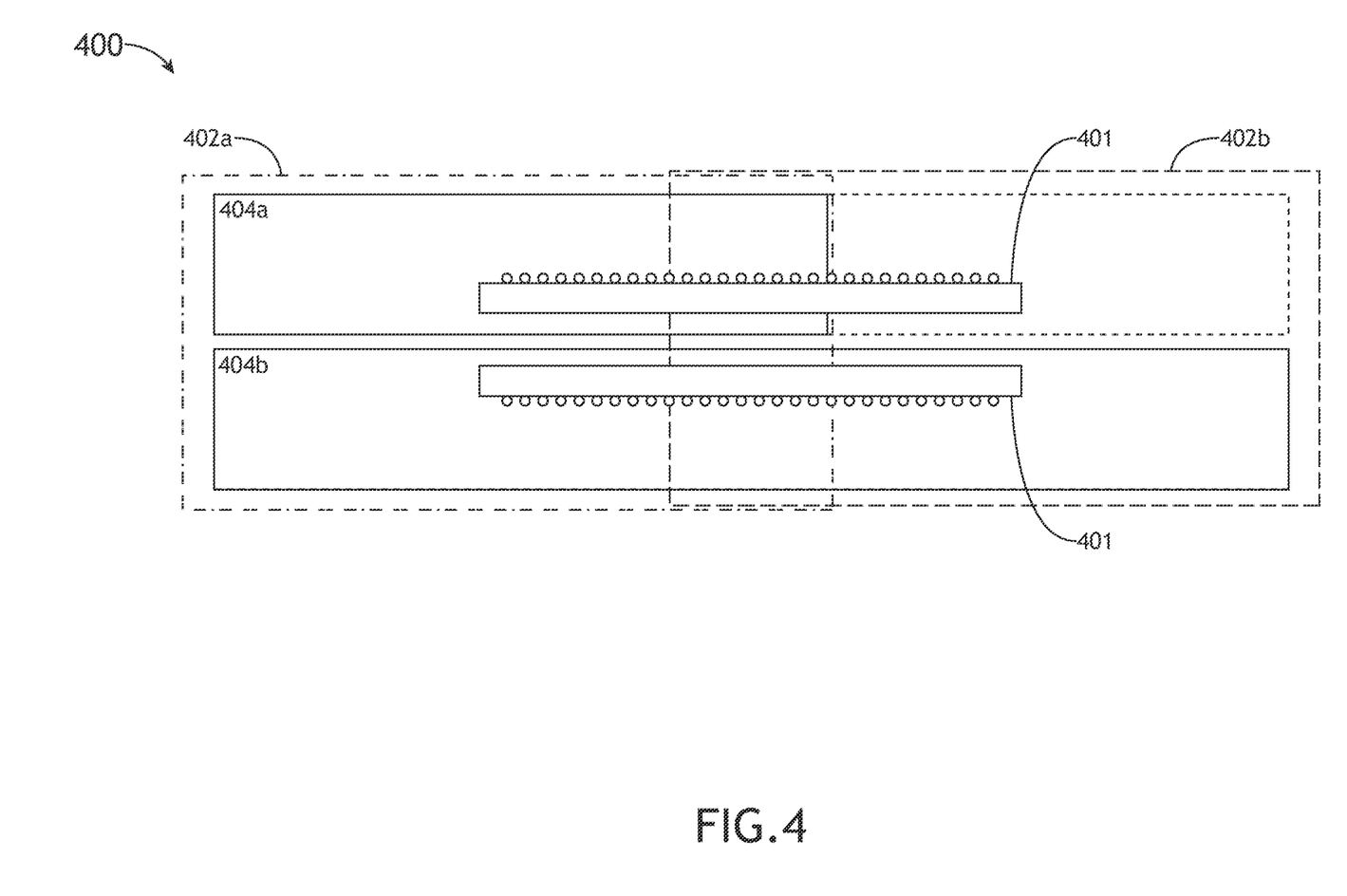
FIG. 4 illustrates a conceptual side view of inspection of larger objects over multiple fields of view, in accordance with one or more embodiments of the present disclosure.

FIG. 4 illustrates a conceptual side view of inspection of larger objects over multiple fields of view, in accordance with one or more embodiments of the present disclosure. In this embodiment, devices that are bigger than the FOV may be presented in multiple steps to the inspection subsystem 106. This results in multiple images that are overlapping and allows for the complete visualization of the device. For example, a first image 402a and a second image 402b may be obtained of a sample 401. In this example, the image 402a overlaps with the image 402b. Side view 404a represents a view of a first side of the sample, while side view 404b represents a view of a second side of the sample. In embodiments, inspection and/or metrology parameters may be set of each image 402a/402b independently. In embodiments, a controller may stich the images 402a, 402b together and treat the resultant image as a single image for the purposes of performing inspection.

Figure 5:
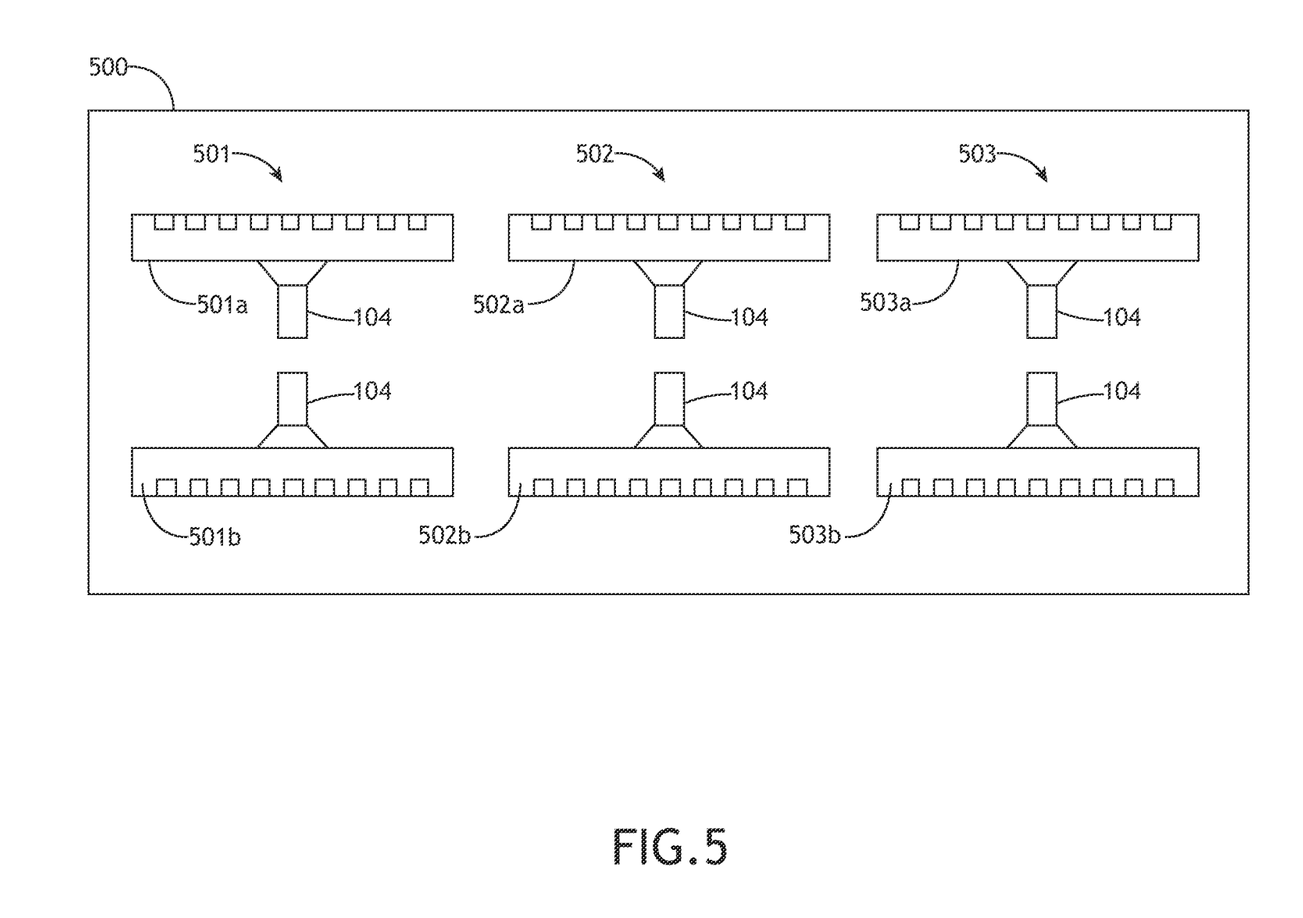
FIG. 5 illustrates a conceptual side view of inspection of multiple samples within a single field of view, in accordance with one or more embodiments of the present disclosure.

FIG. 5 illustrates a conceptual side view of an inspection of multiple samples within a single field of view 500, in accordance with one or more embodiments of the present disclosure. In this embodiment, the inspection subsystem 106 may inspect multiple samples 501, 502, 503 using a single FOV 500. In embodiments, multiple components (e.g., frontside, backside, left, right) of multiple samples 501, 502, 503 may be inspected. Because the optical path is split, in embodiments, the system 100 may simultaneously image, for example, the frontside 501a, 502a, 503a and backside 501b, 502b, 503b of the samples 501, 502, 503 at the same time. This step may be performed without any movement of the samples 501, 502, 503. In turn, in embodiments, a carrier of the system 100 may move the samples to the opposite side of the inspection sub-system, as discussed previously herein, and present the samples 501, 502, 503 for inspection of the other, not inspected sides (e.g., left and right sides in this example).

Figure 6:
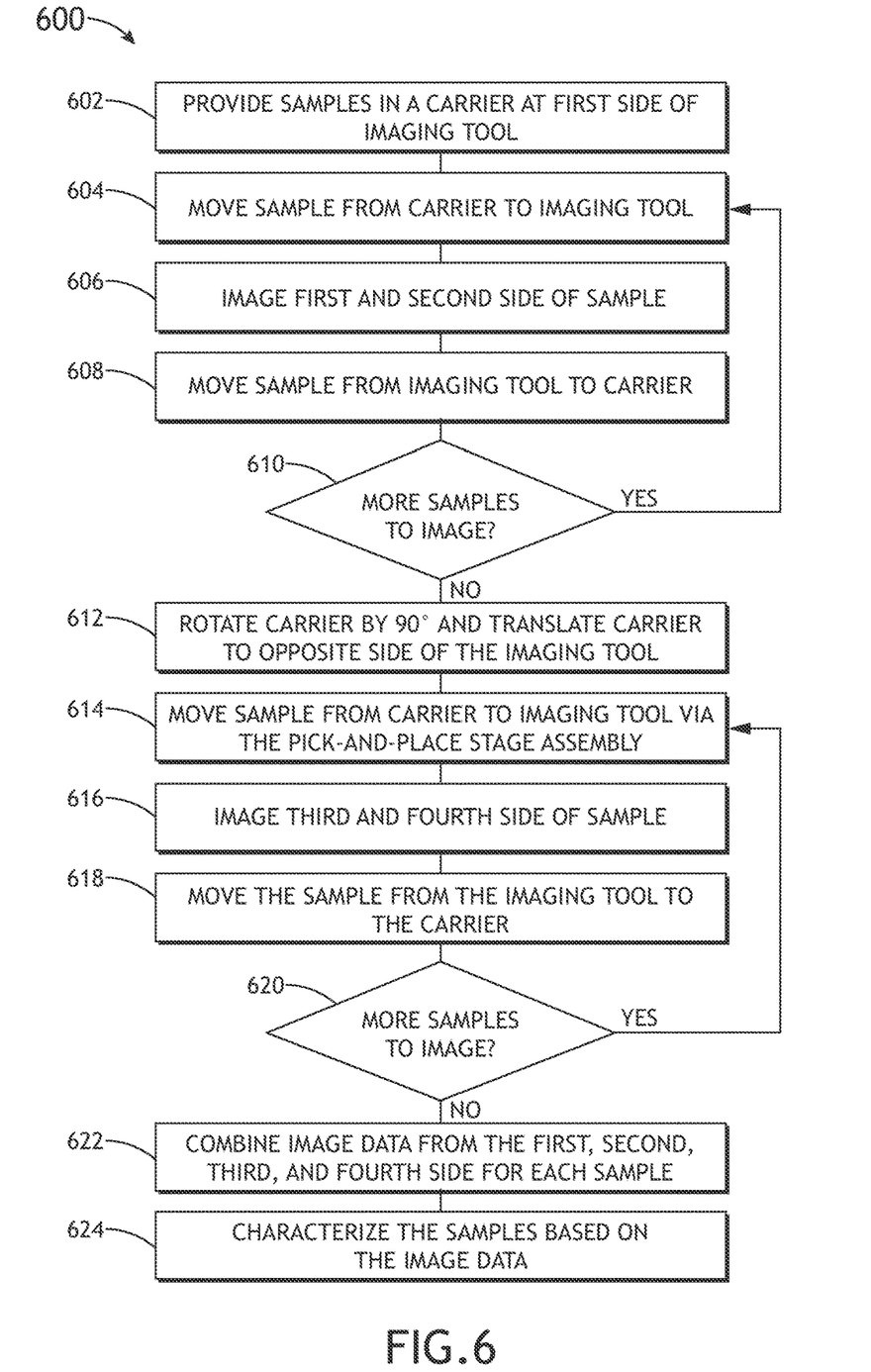
FIG. 6 illustrates a flow diagram depicting a method of characterizing four sides of one or more samples, in accordance with one or more embodiments of the present disclosure.

FIG. 6 illustrates a flow diagram 600 depicting a method of characterizing four sides of one or more samples, in accordance with one or more embodiments of the present disclosure. Applicant notes that the embodiments and components of the characterization system 100 may be implemented to carry out one or more of the steps of the method 600. It is further noted, however, that the method 600 is not limited to the architecture of the characterization system 100.

In step 602, the method 600 includes providing samples 101 in a carrier 102 at a first side of an imaging subsystem 106. In step 604, the method 600 includes moving a sample 101 from the carrier 102 to the imaging subsystem 106. In step 606, the method 600 includes imaging (e.g., imaging to perform inspection or metrology measurements) a first and second side (e.g., front and back side) of the sample 101. In step 608, the method 600 includes moving the sample 101 from the imaging subsystem 106 back to the carrier 102. In step 610, the method 600 determines whether there are additional samples 101 contained in the carrier 102 to image. If there are additional samples 101 to image, then the method 600 returns to step 604 and step 604-610 are repeated. If there are no additional samples 101 to image, then the method 600 moves to step 612. In step 612, the method 600 includes rotating the carrier 102 by 90° and translating the carrier to an opposite side of the imaging subsystem 106. In step 614, the method 600 includes moving a sample 101 from the carrier 102 to the imaging subsystem 106. In step 616, the method 600 includes imaging a third and fourth side of the sample 101. In step 618, the method 600 includes moving the sample 101 from the imaging subsystem 106 back to the carrier 102. In step 620, the method 600 determines whether there are additional samples 101 contained in the carrier 102 to image. If there are additional samples 101 to image, then the method 600 returns to step 614 and step 614-620 are repeated. If there are no additional samples 101 to image, then the method 600 moves to step 622. In step 622, the method 600 combines image data from the first, second, third, and fourth sides for each sample 101. In step 624, the method 600 characterizes (e.g., inspects or performs metrology) the samples 101 based on the image data from step 622.

One skilled in the art will recognize that the herein described components, operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

The previous description is presented to enable one of ordinary skill in the art to make and use the invention as provided in the context of a particular application and its requirements. As used herein, directional terms such as "left," "right," "front," "back," "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A characterization system, comprising:
    a sample carrier;
    a stage assembly including a pick-and-place head;
    an imaging subsystem including a first channel and a second channel, wherein the stage assembly is configured to transfer a sample between the carrier and the imaging subsystem; and
    a controller including one or more processors and memory, the one or more processors configured to execute a set of program instructions stored in the memory, the set of program instructions configured to cause the one or more processors to:
        direct the stage assembly to move the sample from the carrier located at a first position to the imaging subsystem;
        direct the imaging subsystem to inspect a first side of the sample via the first channel of the imaging subsystem and a second side of the sample via the second channel of the imaging subsystem;
        direct the stage assembly to move the sample from the imaging subsystem to the carrier;
        direct the carrier to move to a second position;
        direct the carrier to rotate by 90 degrees relative to an orientation of the carrier in the first position;
        direct the stage assembly to move the sample from the carrier located at the second position to the imaging subsystem; and
        direct the imaging subsystem to inspect a third side of the sample via the first channel of the imaging subsystem and a fourth side of the sample via the second channel of the imaging subsystem; and
        combine one or more images of each of the first side, the second side, the third side, and the fourth side of the sample.

2. The system of claim 1, wherein the controller is further configured to characterize the sample based on the combined one or more images of the sample.

3. The system of claim 2, wherein the controller is further configured to inspect the sample based on the combined one or more images of the sample and identify one or more defects on one or more sides of the sample.

4. The system of claim 3, wherein the controller is further configured to perform a metrology measurement of the sample based on the combined one or more images of the sample to identify one or more critical dimensions of the one or more sides of the sample.

5. The system of claim 1, wherein the first channel includes a first light source assembly and a first set of optics and the second channel includes a second light source assembly and a second set of optics.

6. The system of claim 5, wherein the imaging subsystem further comprises:
    a camera; and
    a set of collection optics configured to receive first channel illumination collected by the first set of optics from the sample and second channel illumination collected by the second set of optics from the sample and direct the first channel illumination and the second channel illumination to the camera.

7. The system of claim 6, wherein the set of collection optics comprises:

a rooftop mirror; and an objective lens, wherein the rooftop mirror is configured to receive first channel illumination collected by the first set of optics from the sample and second channel illumination collected by the second set of optics from the sample and direct the first channel illumination and the second channel illumination to the camera, wherein the objective lens is configured to direct and focus the first channel illumination and the second channel illumination onto one or more sensors of the camera.

8. The system of claim 7, further comprising: an opaque plate positioned between the sample and the rooftop mirror configured to block illumination from traveling directly from the sample to the objective lens and the camera.

9. The system of claim 5, wherein at least one of the first light source assembly or the second light sources assembly comprises:

a coaxial light source; and an oblique light source.

10. The system of claim 9, wherein at least one of the coaxial light source or the oblique light source is independently movable.

11. The system of claim 9, wherein the coaxial source comprises one or more RGB light sources.

12. The system of claim 9, wherein the oblique source comprises one or more RGB light sources.

13. The system of claim 5, wherein at least one of the first set of optics or the second set of optics comprises:

a beam splitter; and a mirror.

14. The system of claim 5, wherein at least one of the first set of optics or the second set of optics are independently movable.

15. The system of claim 1, wherein the pick-and-place head is configured to hold the sample via a vacuum nozzle.

16. A characterization system, comprising:

a controller communicatively couplable to an imaging subsystem, wherein the controller includes one or more processors and memory, the one or more processors configured to execute a set of program instructions stored in the memory, the set of program instructions configured to cause the one or more processors to:

direct a stage assembly of the imaging subsystem to move a sample from a carrier located at a first position to the imaging subsystem;

direct the imaging subsystem to image a first side of the sample via a first channel of the imaging subsystem and a second side of the sample via a second channel of the imaging subsystem;

direct the stage assembly to move the sample from the imaging subsystem to the carrier;

direct the carrier to move to a second position;

direct the carrier to rotate by 90 degrees relative to an orientation of the carrier in the first position;

direct the stage assembly to move the sample from the carrier located at the second position to the imaging subsystem; and direct the imaging subsystem to inspect a third side of the sample via the first channel of the imaging subsystem and a fourth side of the sample via the second channel of the imaging subsystem; and combine one or more images of each of the first side, the second side, the third side, and the fourth side of the sample.

17. A method comprising:

providing a plurality of samples in a carrier at a first side of an imaging tool;

moving one or more of the samples from the carrier to the imaging tool via a pick-and-place stage assembly;

imaging the first side of one or more samples via a first channel of the imaging tool and a second side of the one or more samples via a second channel of the imaging tool;

moving the one or more samples from the imaging tool to the carrier via the pick-and-place stage assembly;

rotating the carrier by 90 degrees and translating the carrier to a second side of the imaging tool opposite the first side;

moving the one or more of the samples from the carrier to the imaging tool via the pick-and-place stage assembly;

imaging a third side of the one or more samples via the first channel of the imaging tool and a fourth side of the one or more samples via the second channel of the imaging tool;

moving the one or more samples from the imaging tool to the carrier via the pick-and-place stage assembly;

combining image data from the first side, second side, third side, and fourth side of the one or more samples; and characterizing the one or more samples based on the image data from the first side, second side, third side, and fourth side of the one or more samples.

* * * * *